(12) United States Patent
Abe

(10) Patent No.: US 6,825,069 B2
(45) Date of Patent: Nov. 30, 2004

(54) SYSTEM AND METHOD FOR FABRICATING A TRANSISTOR BY A LOW TEMPERATURE HEAT TREATMENT PROCESS

(75) Inventor: Daisuke Abe, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/270,379

(22) Filed: Oct. 15, 2002

(65) Prior Publication Data

US 2003/0104646 A1 Jun. 5, 2003

(30) Foreign Application Priority Data

Nov. 30, 2001 (JP) ........................................ 2001-367037

(51) Int. Cl.$^7$ .......................... H01L 21/00; H01L 21/84
(52) U.S. Cl. ........................ 438/149; 438/151; 438/502
(58) Field of Search ................................. 438/149, 150, 438/151, 166, 197, 502, 509

(56) References Cited

U.S. PATENT DOCUMENTS 6,518,102 B1 * 2/2003 Tanaka et al. .............. 438/143

OTHER PUBLICATIONS

Deal et al., "Characteristics of Fast Surface States Associated with $SiO_2$–Si and $S_3N_4$–$SiO_2$–Si Structures", J. Electrochem. Soc. vol. 116, No. 7 (Jul. 1969) pp. 997–1005.

* cited by examiner

Primary Examiner—Hoai Pham
(74) Attorney, Agent, or Firm—Oliff & Berridge, PLC

(57) ABSTRACT

The invention provides a method for fabricating a transistor in which the bulk characteristics of the gate insulating film and the interface characteristics can be simultaneously improved by a low-temperature process. The method can include the step of forming a semiconductor film on a substrate, the step of forming a gate insulating film on the semiconductor film by depositing a silicon oxide film by a diode parallel plate plasma enhanced CVD process using at least TEOS and oxygen as source materials, the step of forming a metal film, which accelerates the decomposition of gases permeated into the gate insulating film, on the gate insulating film, and the step of performing low-temperature heat treatment on the gate insulating film. Accordingly, it is possible to form high-quality gate insulating film having both satisfactory bulk and interface characteristics by a low temperature process.

17 Claims, 8 Drawing Sheets (i)

(j)

(k)

(l)

(m)

SYSTEM AND METHOD FOR FABRICATING A TRANSISTOR BY A LOW TEMPERATURE HEAT TREATMENT PROCESS

BACKGROUND OF THE INVENTION

1. Field of Invention

The present invention relates to methods for fabricating transistors.

2. Description of Related Art

Recently, the use of relatively large transparent substrates composed of inexpensive glass, resins, etc., for electro-optical devices, such as liquid crystal display devices and organic EL display devices has been under study. Such substrates have relatively low heat-resisting temperatures. Therefore, techniques for fabricating semiconductor elements, such as thin-film transistors (TFTs), and various other devices integrated into such substrates by low-temperature processes have been developed. Moreover, since organic EL display devices are operated by a driving current, TFTs having higher driving performance are required, and techniques for fabricating low-temperature polysilicon TFTs are important.

A step of forming a high-quality gate insulating film of a MOS transistor is absolutely necessary to the fabrication process for a low-temperature polysilicon TFT, which is generally performed at 500° C. or less. The quality of the gate insulating film considerably affects transistor performance. In order to form the gate-insulating film, for example, an ECR plasma enhanced chemical vapor deposition process (ECR-PECVD process) or a diode parallel plate RF plasma enhanced CVD process is used.

SUMMARY OF THE INVENTION

In an element having a layered structure, the performance of the element may be impaired by structural defects in the layers or at the interfaces between the layers. For example, in a TFT, structural defects in the gate insulating film and at the interface between the gate insulating film and the semiconductor film (MOS interface) affect electrical characteristics of the transistor and cause a variation in electrical characteristics.

With respect to a gate insulating film formed by the ECR-PECVD process so that the density of interface trap state is decreased, the flat band voltage shift is large, and the dielectric breakdown voltage is small. Therefore, a further improvement in the bulk characteristics of the gate insulating film is desired. On the other hand, with respect to a gate insulating film formed by the diode parallel plate RF plasma enhanced CVD process, although the bulk characteristics are generally satisfactory, the MOS interface includes many defects due to dangling bonds, etc. In either process, it is difficult to obtain a gate insulating film in which both the bulk characteristics and the MOS interface characteristics are satisfactory.

Accordingly, it is an object of the present invention to provide a method for fabricating a transistor having satisfactory electrical characteristics.

It is another object of the present invention to provide a method for fabricating a TFT having a gate insulating film with satisfactory electrical characteristics.

It is another object of the present invention to provide a method for fabricating a transistor in which the bulk characteristics of the gate insulating film and the interface characteristics can be simultaneously improved by a low-temperature process.

In order to achieve the objects described above, in one aspect of the present invention, a method for fabricating a transistor can include the steps of forming a semiconductor film on a substrate, forming a gate insulating film on the semiconductor film by depositing a silicon oxide using at least tetraethoxysilane (TEOS) and oxygen as source materials, forming a metal film on the gate insulating film, the metal film accelerating the decomposition of gases permeated into the gate insulating film, and performing low-temperature heat treatment to the gate insulating film.

In such a method, the defect density at the MOS interface can be decreased, the charge density in the gate insulating film can be decreased, and the dielectric breakdown voltage can be increased. Thereby, it is possible to fabricate a transistor having a high-quality gate insulating film by a low-temperature process.

As long as the metal film lies on the gate insulating film, the heat treatment may be performed before or after patterning, or in any step in the fabrication process of the transistor or until the fabrication of a panel provided with a plurality of transistors is completed.

Preferably, the method can further include the step of patterning the metal film so that the metal film is used as a gate wiring film of the transistor. Thus, the used metal film is reused as gate lines. In this way, it is possible to omit the step of forming a gate wiring film.

Preferably, the method further includes the steps of removing the metal film and forming a wiring film on the gate insulating film, the wiring film forming a gate of the transistor. Consequently, it is possible to use an appropriate gate wiring film.

Preferably, the heat treatment to the gate insulating film is performed at 300° C. or more and in a temperature range which does not affect the semiconductor film and the substrate. Consequently, it is possible to fabricate the transistor by a low-temperature process.

Preferably, the step of forming the gate insulating film is performed so that the temperature of the substrate does not exceed 400° C. Consequently, softening and deterioration of the substrate are prevented.

Preferably, in the heat treatment step, the metal film accelerates the decomposition or removal of impurities, such as oxygen ($O_2$), water vapor ($H_2O$), and hydrogen ($H_2$), contained in the gate insulating film. Although any material which decomposes or removes impurities may be used, a metal is preferred. The metal film may be composed of, for example, aluminum, magnesium, an aluminum-magnesium alloy, or an alloy containing aluminum or magnesium. Consequently, the defect density in the silicon oxide film or at the interface between the silicon oxide film and the semiconductor film is decreased. One of the reasons for the decrease in the defect density is considered to be that dangling bonds lying in the film or at the interface are terminated by various chemical species, such as hydrogen radicals, hydroxy radicals, hydrogen ions, and hydroxy ions, generated by the catalytic action of the metal.

Preferably, the thin-film transistor is fabricated by a low-temperature process. Usually, it is difficult to form a gate insulating film having both excellent bulk characteristics and excellent MOS interface characteristics by a low-temperature process. However, in the gate insulating film of the thin-film transistor described above, both the bulk characteristics and the MOS interface characteristics are satisfactory. Consequently, it is possible to form thin-film transistors having satisfactory characteristics on an inexpensive substrate, such as a glass substrate of which area can be increased.

Preferably, the fabrication method can further include, after the step of forming the semiconductor film, the step of crystallizing the semiconductor film by laser annealing. Herein, the "crystallization" may be any one of polycrystallization, microcrystallization, and monocrystallization.

A transistor of the present invention can be fabricated by the fabrication method described above.

In another aspect of the present invention, a transistor includes a semiconductor film disposed on a substrate, a gate insulating film disposed on the semiconductor film, and a gate electrode disposed on the gate insulating film. The gate insulating film is composed of an insulator which is coated with an impurity-removing film for decomposing or removing impurities and which is subjected to heat treatment.

Preferably, the impurity-removing film contains at least one of aluminum and magnesium. Preferably, the insulator is formed by depositing a silicon-containing compound (e.g., TEOS) by a diode parallel plate plasma enhanced CVD process.

In another aspect of the present invention, in an electro-optical device, by using the transistor described above, performance is improved.

In another aspect of the present invention, an electronic apparatus includes the transistor, and the examples of the electronic apparatus include display devices, such as liquid crystal display devices and organic EL display devices, mobile phones, digital cameras, personal computers, and information processing devices.

It is possible to improve the characteristics of such electronic apparatuses using transistors having satisfactory characteristics which have been fabricated by low-temperature processes.

BRIEF DESCRIPTION OF THE DRAWINGS

The present invention will be described in detail with reference to the accompanying drawings, wherein like numerals reference like elements, and wherein.

DETAILED DESCRIPTION OF PREFERRED EMBODIMENTS

Figure 1:
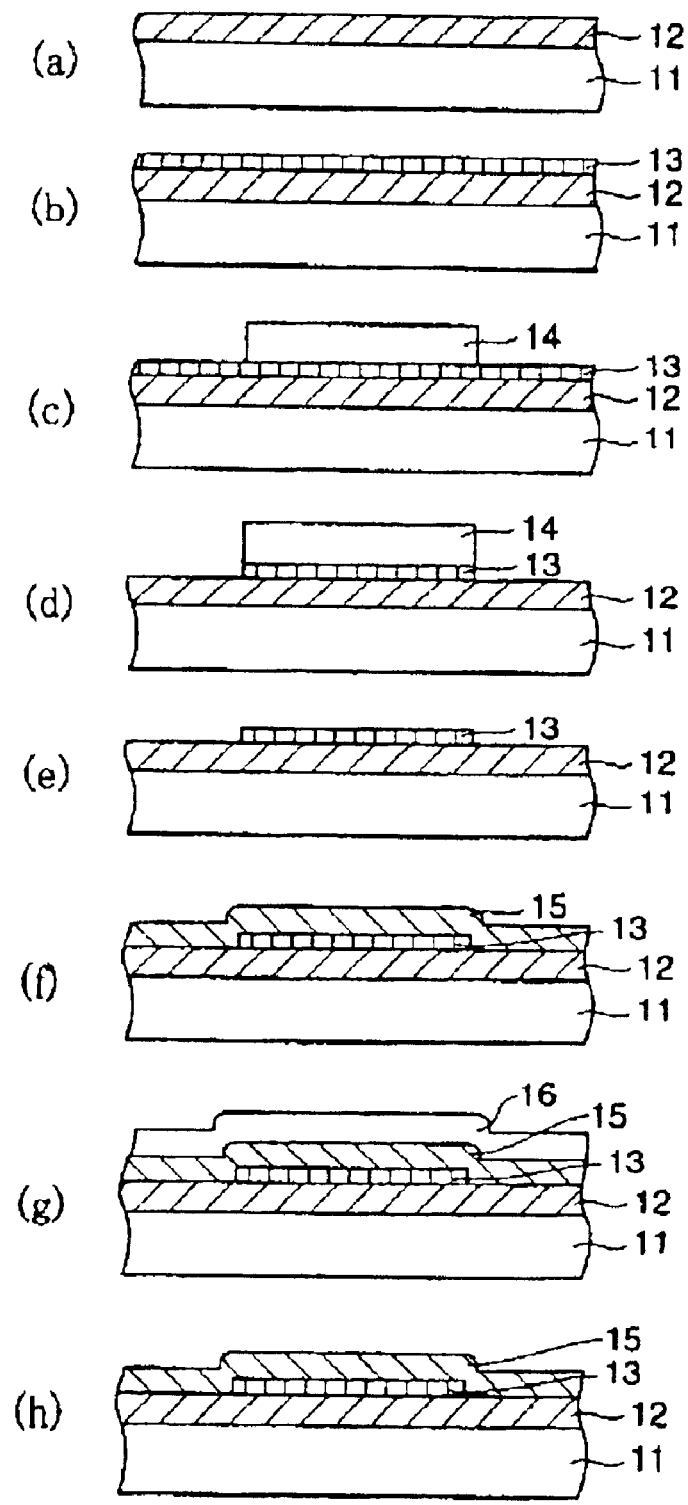
FIGS. 1(a) to 1(h) are schematic diagrams showing fabrication steps in an embodiment of the present invention.

FIGS. 1(a) to 1(h) and FIGS. 2(i) to 2(m) are schematic diagrams showing steps in a method for fabricating a thin-film transistor (TFT) in an embodiment of the present invention. As shown in FIG. 1(a), a protective underlayer 12 is formed on a substrate 11. Serving as the substrate 11, a transparent insulating substrate, such as a quartz substrate, a glass substrate, or a heat-resistant plastic substrate, is used. The protective underlayer 12 prevents mobile ions, such as sodium ions, contained in the glass substrate from being mixed into a semiconductor film, which will be described below. The protective underlayer 12 is composed of an insulating material, such as a silicon oxide ($SiO_x$:$0<x\leq2$) or a silicon nitride ($Si_3N_x$:$0<x\leq4$).

The protective underlayer 12 is formed on the substrate 11 by a CVD process, such as an atmospheric pressure chemical vapor deposition (APCVD) process, a low pressure chemical vapor deposition (LPCVD), or a plasma enhanced chemical vapor deposition (PECVD) process, or by a sputtering process after the substrate 11 is cleaned using pure water or an organic solvent, such as an alcohol. When a silicon oxide film is used as the protective underlayer 12, in the APCVD process, the substrate temperature may be set at approximately 250° C. to 450° C., and monosilane ($SiH_4$) and oxygen may be used as raw materials. In the PECVD process or the sputtering process, the substrate temperature is from ambient temperature to approximately 400° C. The protective underlayer 12 has a thickness that is sufficient to prevent the diffusion and mixing of impurity elements from the substrate. For example, the thickness of the protective underlayer 12 is approximately 100 nm or more. In consideration of variations among lots and substrates, the thickness of the protective underlayer 12 is preferably approximately 200 nm or more, and if the thickness is approximately 300 nm, the protective underlayer 12 satisfactorily functions as a protective layer. If the thickness of the protective underlayer (insulating film) 12 is excessively large, cracking easily occurs due to stress in the layer. In this respect, the maximum thickness of the protective underlayer 12 is preferably approximately 2 μm. However, when productivity is taken into consideration, the thickness of the protective underlayer 12 is preferably approximately 1 μm.

Next, as shown in FIG. 1(b), a semiconductor film 13 is formed on the protective underlayer 12. Although the protective underlayer 12 is not absolutely necessary, since it is important to prevent impurities from entering into the semiconductor film 13 when the semiconductor thin-film transistor is formed on a glass substrate, preferably, the semiconductor film 13 is deposited after the protective underlayer 12 is formed so that mobile ions, such as sodium ions, in the glass substrate 11 are not mixed into the semiconductor film 13.

As the semiconductor film 13, a single elementary semiconductor film composed of a group IV element, such as silicon (Si) or germanium (Ge), a IV compound semiconductor film composed of silicon germanide ($Si_xGe_{1-x}$:$0<x<1$), silicon carbide ($Si_xC_{1-x}$:$0<x<1$), or germanium carbide ($Ge_xC_{1-x}$:$0<x<1$), a III–V compound semiconductor film composed of gallium arsenide (GaAs) or indium antimonide (InSb), or a II–VI compound semiconductor film composed of cadmium selenide (CdSe) or the like may be used.

Additionally, a complex compound semiconductor film composed of silicon-germanium-gallium-arsenic ($Si_xGe_yGa_zAs_z$:x+y+z=1) or the like, an n-type semiconductor film in which such a semiconductor film is doped with a donor element, such as phosphorus (P), arsenic (As), or antimony (Sb), or a p-type semiconductor film in which such a semiconductor film is doped with an acceptor element, such as aluminum (Al), gallium (Ga), or indium (In) may also be used as the semiconductor film 13.

The semiconductor film 13 may be formed by a CVD process, such as an APCVD process, an LPCVD process, or a PECVD process, or a PVD process, such as a sputtering process or a vapor deposition process.

When a silicon film is used as the semiconductor film 13, in the LPCVD process, silicon may be deposited using disilane ($Si_2H_6$), etc., as raw materials, with a substrate temperature of approximately 400° C. to 700° C. In the PECVD process, silicon may be deposited using monosilane ($SiH_4$), etc., as raw materials, with a substrate temperature of approximately 100° C. to 500° C.

When the sputtering process is used, the substrate temperature is from ambient temperature to approximately 400° C. Although the initial state of the deposited semiconductor film 13 may be varied, for example, amorphous, mixed crystalline, microcrystalline, or polycrystalline, any initial state is acceptable. When the semiconductor film 13 is used for a semiconductor thin-film transistor, the appropriate thickness of the semiconductor film 13 is approximately 20 to 100 nm.

Next, the deposited semiconductor film 13 is crystallized. Herein, the term "crystallization" can be used to describe that thermal energy that is applied to an amorphous semiconductor film so that the amorphous semiconductor film is transformed into a polycrystalline or monocrystalline semiconductor film, and also that thermal energy that is applied to a microcrystalline or polycrystalline semiconductor film so that the quality of the crystalline film is improved and recrystallization is performed by melt-solidification. It is to be noted that crystallization of an amorphous material as well as crystallization of polycrystalline and microcrystalline materials are referred to as crystallization.

The crystallization of the semiconductor film 13 may be performed by a so-called "laser irradiation method" or a solid phase growth method. However, it should be understood that the invention is not limited thereto.

As an example of methods for fabricating polysilicon TFTs, a crystallization method by laser irradiation which is a low-temperature process will be described.

The substrate provided with the semiconductor film 13 is arranged in a laser irradiation chamber (not shown in the drawing). A quartz window is formed in the laser irradiation chamber, and a laser beam is applied through the quartz window in a vacuum or after the atmosphere in the chamber is replaced with a nonoxidizing gas. Preferably, the laser beam is strongly absorbed by the surface region of the semiconductor film 13 and is not substantially absorbed by the protective underlayer 12 or the substrate 11. Preferred examples of the laser beam include excimer laser beams which have wavelengths in the ultraviolet bands or in the vicinity thereof, argon ion laser beams, and YAG laser harmonics. In order to heat the semiconductor film 13 at a high temperature and simultaneously prevent damage to the substrate 11, a large-output laser which generates laser beams for an extremely short period in a pulsed manner must be used. Among the laser beams described above, in particular, excimer laser beams, such as xenon chloride (XeCl) laser beams (wavelength:308 nm) and krypton fluoride (KrF) laser beams (wavelength:248 nm), are most suitable.

An irradiation method of such laser beams will be described. The intensity full width at half maximum of the laser pulse is extremely short, from approximately 10 to 500 ns. The substrate 11 is irradiated with laser beams at approximately ambient temperature (25° C.) to 400° C. The irradiation area of one shot of laser irradiation is approximately 5 mm by 5 mm to 60 mm by 60 mm square or rectangular.

For example, the case in which a beam which can crystallize an area of approximately 8 mm by 8 mm square by one shot of laser irradiation is used will be described below. After one shot of laser irradiation is performed on one spot, the relative position of the substrate and the laser is slightly moved horizontally. After this, one shot of laser irradiation is performed again. By repeated shooting and scanning, it is possible to cope with a substrate with a large area. More specifically, shooting is repeated by shifting the irradiation region by approximately 1% to 99% for each time.

After scanning horizontally (in the X direction), the relative position is shifted vertically (in the Y direction) by an appropriate amount. Shooting and scanning are continuously performed while shifting the position horizontally by a predetermined amount. The first laser irradiation is thus performed over the entire surface of the substrate.

The energy density of the first laser irradiation is preferably approximately 50 $mJ/cm^2$ to 600 $mJ/cm^2$ in the case of a xenon chloride laser. After the first laser irradiation is completed, second laser irradiation is performed over the entire surface as required.

When the second laser irradiation is performed, the energy density is preferably higher than the first laser irradiation, for example, approximately 100 $mJ/cm^2$ to 1,000 $mJ/cm^2$. Scanning is performed by shifting square irradiation regions by the appropriate amounts in the Y direction and in the X direction in the same manner as that in the first laser irradiation.

Furthermore, third laser irradiation or fourth laser irradiation with a higher energy density may be performed as required. By using such a multistage laser irradiation method, it is possible to completely eliminate the variations due to the edges of the laser irradiation regions.

In either multistage laser irradiation or ordinary single-stage irradiation, laser irradiation is performed with an energy density that is lower than the energy density which completely melts all the semiconductor film 13 by approximately 5%. If the silicon film is completely melted, the liquid silicon film is in a supercooled state, and as a result, crystal nucleation occurs at a high density.

The poly-Si film formed by such a phenomenon is in a so-called "microcrystalline form" in which extremely small grains are present at a high density. Since there are many grain boundaries in such a poly-Si film, a large amount of defects (mainly, dangling bonds) is present in the film, and as a result, the poly-Si film is not usable for TFTs.

Although the laser crystallization method using a square laser beam has been described above, the irradiation region may be in a linear form with a width of approximately 100 $\mu$m or more and a length of several tens of centimeters or more, and crystallization may be performed by scanning with the line laser beam. In such a case, scanning is performed so that the beam widths overlap by approximately 5% to 95%. If the beam width is 100 $\mu$m and the beam width overlap rate is 90%, since the beam moves 10 µm for each time of irradiation, one point is subjected to ten times of laser irradiation.

In general, in order to crystallize the semiconductor film homogeneously over the entire substrate, at least five times of laser irradiation are desired. Therefore, the beam width overlap rate for each time of irradiation must be approximately 80% or more. In order to reliably obtain a polycrystalline film having high crystallinity, the overlap rate is preferably adjusted at approximately 90% to 97% so that one point is subjected to approximately ten times to thirty times of irradiation. By using the line beam, a large area can be crystallized by scanning in one direction. Therefore, a higher throughput can be obtained compared to the square beam.

By performing multiple times of irradiation, it is also possible to enhance the activation rates of impurities introduced into the semiconductor film. At this stage, the conditions for the maximum irradiation energy density are the same as those described above.

Next, isolation which delimits a region for a TFT is performed. In order to perform isolation, although a LOCOS method, a field shield method, an STI method, or the like may be used, herein, a general method in which isolation is performed by photolithography and etching in the TFT fabrication step will be described.

As shown in FIG. 1(c), a mask pattern composed of a photoresist layer 14 is formed by photolithography so that only a region functioning as an active layer of the transistor remains.

Next, as shown in FIG. 1(d), the semiconductor film 13 is wet etched or dry etched using the photoresist layer 14 as a mask. Then, as shown in FIG. 1(e), the photoresist layer 14 is stripped.

Next, as shown in FIG. 1(f), after the semiconductor film 13 is formed, an insulating film 15 which acts as a gate insulating film of the TFT is formed thereon.

In order to form the insulating film 15, an insulating material is deposited by a CVD process, such as an atmospheric pressure chemical vapor deposition (APCVD) process, a low pressure chemical vapor deposition (LPCVD), or a plasma enhanced chemical vapor deposition (PECVD) process, or by a sputtering process. Either of the above methods is acceptable.

In this embodiment of the present invention, as the insulating film 15, a silicon oxide ($SiO_2$) film is formed by a diode parallel plate RF plasma enhanced CVD process using TEOS. As will be described below, by combining this process and the subsequent formation of the metal film and heat treatment, it is possible to improve the MOS interface.

In such a case, tetraethoxysilane (TEOS; $Si(OC_2H_5)_4$) and oxygen ($O_2$) are used in the vacuum plasma chamber, and a dilution gas, such as helium (He) or argon (Ar) maybe added thereto. Preferably, the degree of vacuum is approximately 100 to 200 Pa, and the substrate temperature during the film formation is approximately 300° C. to 400° C. By forming the film under such conditions, it is possible to obtain a high-quality silicon oxide film (gate insulating film) 15 having a high dielectric breakdown voltage and a low charge density.

Next, as shown in FIG. 1(g), a metal film 16 is deposited on the gate insulating film 15. Herein, the metal film 16 accelerates the decomposition or removal of impurities, such as water vapor ($H_2O$) and oxygen ($O_2$), contained in the silicon oxide film in the heat treatment step. Although any material which decomposes or removes impurities may be used, a metal is preferred. The metal film may be composed of, for example, aluminum (Al), magnesium (Mg), an aluminum-magnesium alloy, an alloy containing aluminum or magnesium, or a nitride or oxide of aluminum or magnesium. By the metal film 16, the defect density in the silicon oxide film or at the interface between the silicon oxide film and the semiconductor film can be decreased. The reason for the decrease in the defect density is considered to be that dangling bonds lying in the film or at the interface are terminated by various chemical species, such as hydrogen radicals, hydroxy radicals, hydrogen ions, and hydroxy ions, generated by the catalytic action of the metal film 16.

The metal film 16 may be formed by a sputtering process, a vapor deposition process, a CVD process, or any other process. However, in order to deposit a metal on a large area, a sputtering process is effective. As described above, the metal film is preferably composed of a relatively active metal, such as aluminum or magnesium. Consequently, the gate insulating film 15 is improved much more effectively compared with the case in which a chemically stable metal, such as gold or platinum is deposited, as will be described below. Additionally, a metal, such as an alkali metal, which moves in the silicon oxide film 15, i.e., which generates so-called "mobile ions", is not desirable for use as the metal film because it deteriorates the quality of the insulating film.

After the appropriate metal film 16 is deposited, heat treatment is performed at 300° C. or more for 10 minutes or more. The heat treatment may be performed in any atmosphere. By performing the heat treatment, it is possible to decrease the density of interface trap state between the semiconductor film 13 and the silicon oxide film 15 while maintaining good characteristics of the dielectric breakdown voltage and charge density of the silicon oxide film 15. As will be described below, it was discovered by experimentation that the density of the interface trap state was decreased to $3 \times 10^{10}$ ($cm^2 eV-1$) or less by performing heat treatment at 400° C. for 1 hour after aluminum (Al) was deposited. This density of the interface trap state is extremely low, which is comparable to the density of the interface trap state of a thermally oxidized film, and it is considered that a satisfactory interface is formed.

Next, as shown in FIG. 1(h), the metal film 16 is removed. In consideration of compatibility with the subsequent steps, or when a more preferable material is desired to be used as a gate wiring film, the entire metal film formed in the previous step is removed.

Figure 2:
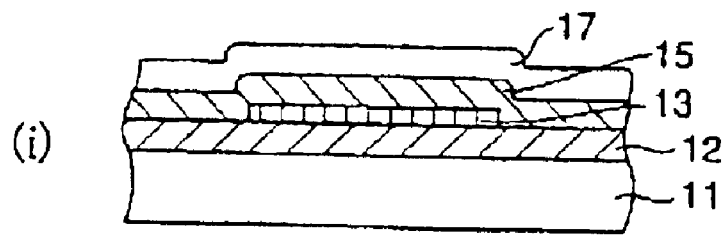
FIGS. 2(i) to 2(m) are schematic diagrams showing steps in an embodiment of the present invention.
Figure 2:
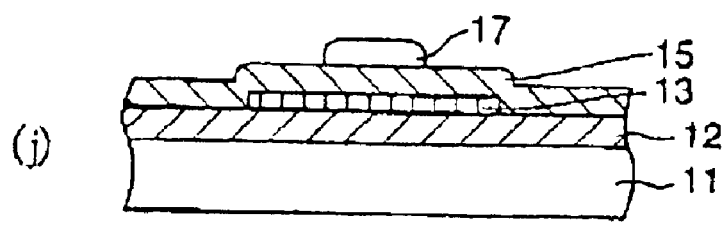
Figure 2:
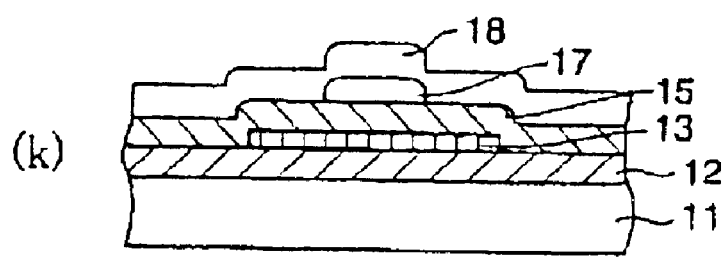
Figure 2:
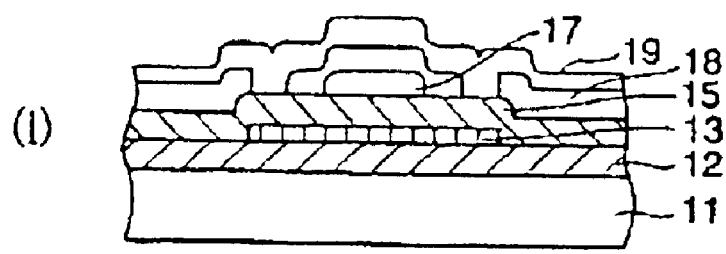
Figure 2:
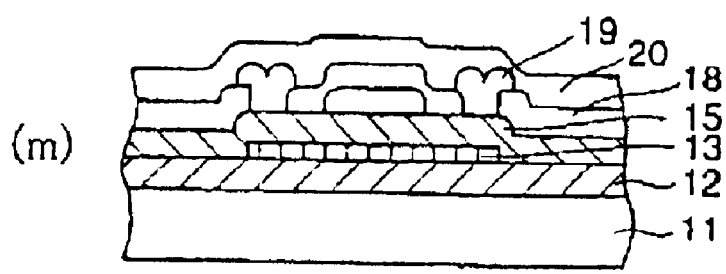

As shown in FIG. 2(i), a gate wiring film 17 is formed on the silicon oxide film (gate insulating film) 15. At this stage, the metal film 16 used in the previous step may be used as it is as the entirety or a part of the gate wiring film 17.

The gate wiring film 17 may be newly formed. The gate wiring film 17 may be deposited using an appropriate metal, such as tantalum, aluminum, or titanium, a metal nitride, polysilicon, or the like by selecting an appropriate deposition process, such as a sputtering process, a CVD process, or a vapor deposition process.

As shown in FIG. 2(j), a gate line 17 is formed by patterning the gate wiring film 17.

Next, impurity ions are introduced into the semiconductor film 15 to form source and drain regions. At this stage, since the gate electrode 17 acts as a mask for ion introduction, a self-aligned structure is obtained in which a channel is formed only under the gate electrode. Introduction of impurity ions may be performed either by ion doping, in which a hydride of the impurity element to be introduced and hydrogen are introduced into the film by a non-mass separation type doping system, or by ion implantation, in which only a desired impurity element is introduced into the film by a mass separation type ion implanter. As a source gas for ion doping, a hydride of the impurity element to be introduced, such as phosphine ($PH_3$) or diborane ($B_2H_6$), which is diluted in hydrogen to a concentration of approximately 0.1% to 10% is used. In order to stably maintain the gate insulating film, the substrate temperature is preferably 350° C. or less during ion introduction in either ion doping or ion implantation. When a CMOSTFT is fabricated, ion introduction is performed by the method described above alternately on the NMOS and PMOS, using an appropriate mask composed of a polyimide resin or the like while covering either one of the NMOS or PMOS with the mask.

Next, the impurity is activated. In order to perform activation, an appropriate method may be selected, for example, laser irradiation, a method in which heating is performed in a furnace at a temperature of 300° C. or more (low-temperature heat treatment), or high-speed heat treatment by a lamp.

The isolation of the semiconductor film 13 and the formation of the gate wiring film 16 have been thus completed.

Next, as shown in FIG. 2(k), an interlayer insulating film 18 is formed by depositing a silicon oxide on the substrate 11 by a CVD process or the like.

As shown in FIG. 2(l), contact holes are formed in the interlayer insulating film 18 and the gate insulating film 15 at the positions corresponding to the source and drain regions, and a metal, such as aluminum, is deposited by a sputtering process or a PVD process to form a wiring film 19.

Next, as shown in FIG. 2(m), the wiring film 19 is patterned to form source and drain electrodes and lines 19. A protective film 20 is formed thereon by the deposition of a silicon oxide, a silicon nitride, PSG, or the like, and a thin-film transistor is thereby completed.

In the embodiment, the process steps are performed in the order described above. However, it should be understood that the processing order may be changed appropriately. For example, isolation may be performed after the formation of the gate insulating film 15, or before the formation of the gate wiring film 15, or impurity introduction may be performed using a resist mask or the other metal mask.

Additionally, the fabrication method may further include the step of improving the film quality by plasma treatment or the like immediately after the crystallization or immediately after the formation of the gate insulating film 15.

Furthermore, immediately after the formation of the gate insulating film 15, when the metal film 16 is used as it is as the entirety or a part of the gate wiring film 17, and if heat treatment is subsequently performed at 300° C. or more for 10 minutes or more, the heat treatment step immediately after the formation of the metal film 16, which has been described above, may be omitted. That is, the heat treatment after the formation of the metal film 16 may be performed with appropriate timing, for example, before or after the patterning of the gate wiring film 17 (or 16), in the fabrication process of the transistor, or until the fabrication of a panel provided with a plurality of transistors is completed.

Figure 3:
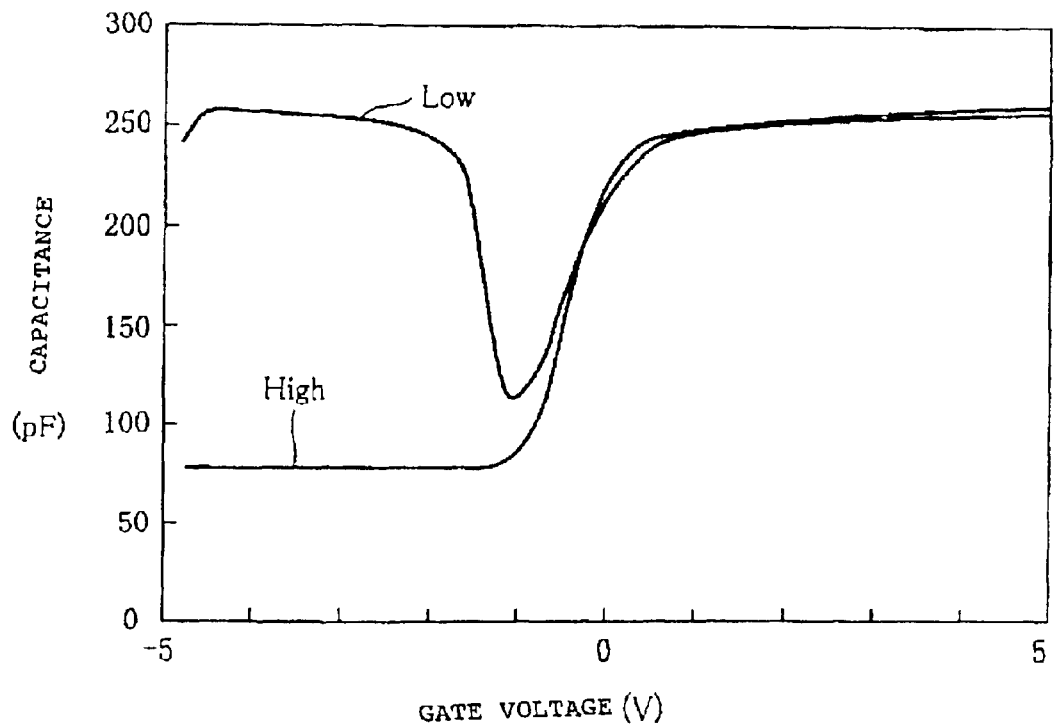
FIG. 3 is a graph which shows the C-V characteristics of a gate insulating film in the present invention.
Figure 4:
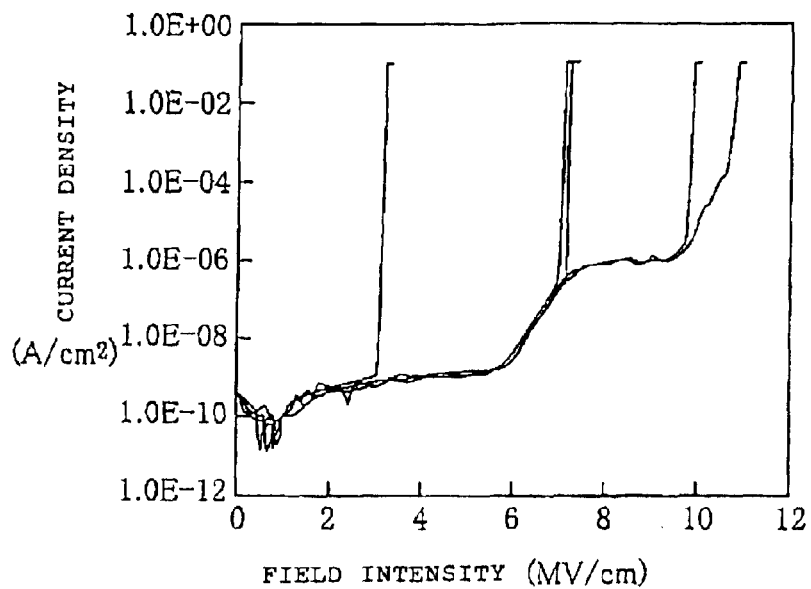
FIG. 4 is a graph which shows the dielectric breakdown characteristics of a gate insulating film in the present invention.

Next, the characteristics of the gate insulating film obtained in the embodiment described above will be described with reference to FIGS. 3 to 8. FIGS. 3 and 4 are graphs which show the characteristics of a gate insulating film of a TFT fabricated by the method in accordance with the present invention, in which the insulating film (silicon oxide film) was formed using TEOS by the diode parallel plate plasma enhanced CVD process, and then aluminum was deposited thereon, followed by low-temperature heat treatment (in a nitrogen atmosphere, 400° C., 1 hour).

FIG. 3 is a graph showing the relationship between the capacitance (C) of the gate insulating film according to the TFT fabrication method of the present invention versus the gate voltage (V). In the graph, the low frequency (Low) characteristic curve shows the characteristics with an applied frequency of 5 to 10 Hz, in which a depression occurs in the vicinity of −1 volt. The high frequency (High) characteristic curve shows the characteristics with an applied frequency of 100 kHz, in which the curve rises in the vicinity of −1 volt. It is possible to calculate the density of the interface trap state based on the two characteristic curves at this part (a quasi-static method). According to this method, the density of the interface trap state (Dit) is estimated to be $2.7 \times 10^{10}/cm^2 eV$, which is a low value comparable to that of an insulating film obtained by usual thermal oxidation. The flat band shift is substantially 0 V. Consequently, a satisfactory interface is formed.

FIG. 4 is a graph showing the I-V characteristics (breakdown voltage characteristics) of a gate insulating film fabricated by the TFT fabrication method of the present invention. In the parts in which the current rapidly increases, dielectric breakdown has occurred. The dielectric breakdown voltage is 8 MV on the average, exhibiting high insulation performance.

Consequently, in accordance with the fabrication method of the present invention, an interface with a low density of interface trap state is formed, and a satisfactory gate insulating film with a high dielectric breakdown voltage and a small flat band voltage shift is obtained.

Figure 5:
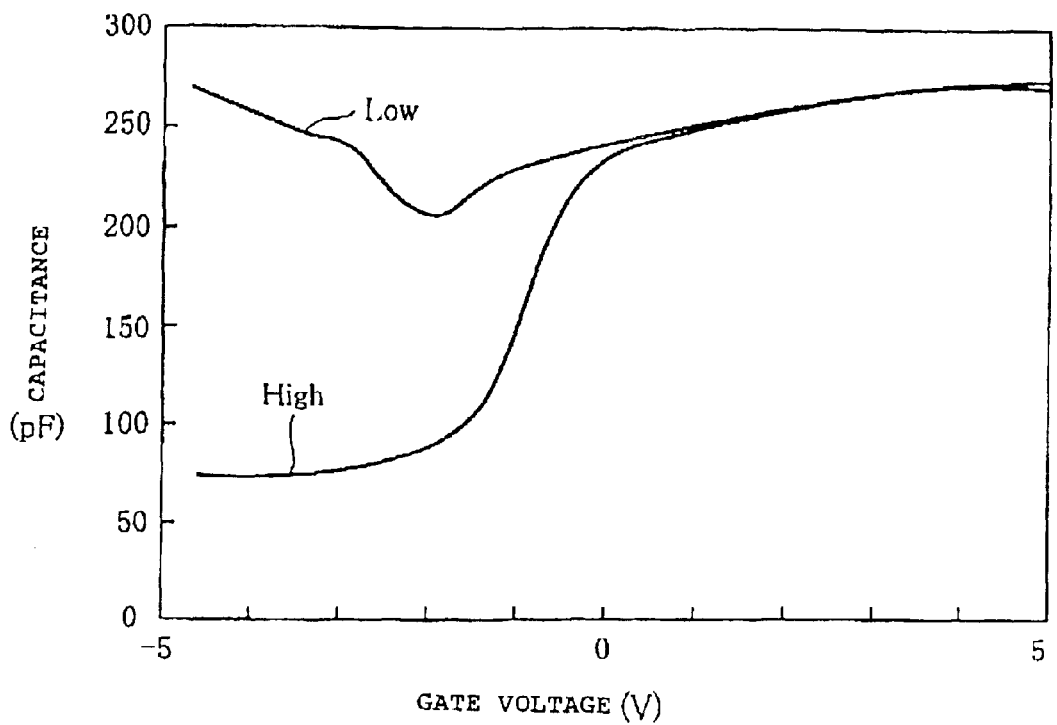
FIG. 5 is a graph which shows the C-V characteristics of a gate insulating film in a comparative example.
Figure 6:
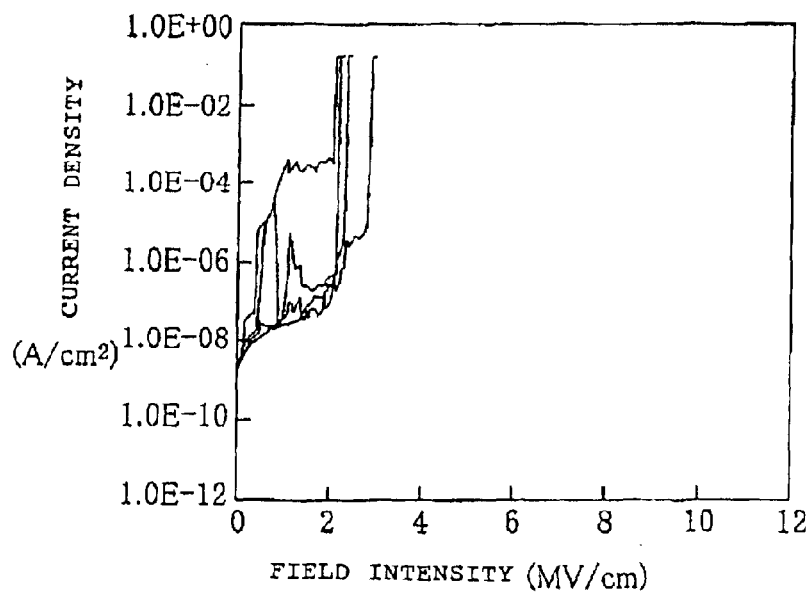
FIG. 6 is a graph which shows the dielectric breakdown characteristics of a gate insulating film in a comparative example.

FIGS. 5 and 6 are graphs which show the characteristics (comparative examples) of a gate insulating film formed by a conventional TET fabrication method. As the comparative example with respect to the density of interface trap state (Dit), FIG. 5 shows the C-V characteristics of the gate insulating film which was formed by depositing a silicon oxide by a diode parallel plate RF plasma enhanced CVD process under the same conditions as those in the case of FIG. 3, followed by heat treatment in a nitrogen atmosphere at 400° C. for 1 hour, without depositing aluminum. Based on the result thereof, the density of interface trap state (Dit) was estimated to be $8.5 \times 10^{10}/cm^2 eV$, which was higher, by ten times or more, than the case in which the gate insulating film was subjected to heat treatment after aluminum was deposited thereon.

As the comparative example with respect to the dielectric breakdown voltage, FIG. 6 shows the I-V characteristics of a gate insulating film formed by depositing a silicon oxide film by an ECR plasma enhanced CVD process, followed by heat treatment. From the graph, it was found that the dielectric breakdown voltage was 2.5 MV on the average.

Consequently, it has been confirmed that the fabrication method of the present invention, in which an insulating film is formed using TEOS by a diode parallel plate plasma enhanced CVD process and aluminum is deposited on the insulating film, followed by low-temperature heat treatment, provides a gate insulating film having more satisfactory characteristics (with respect to interface defects, the breakdown voltage, etc.).

Figure 7:
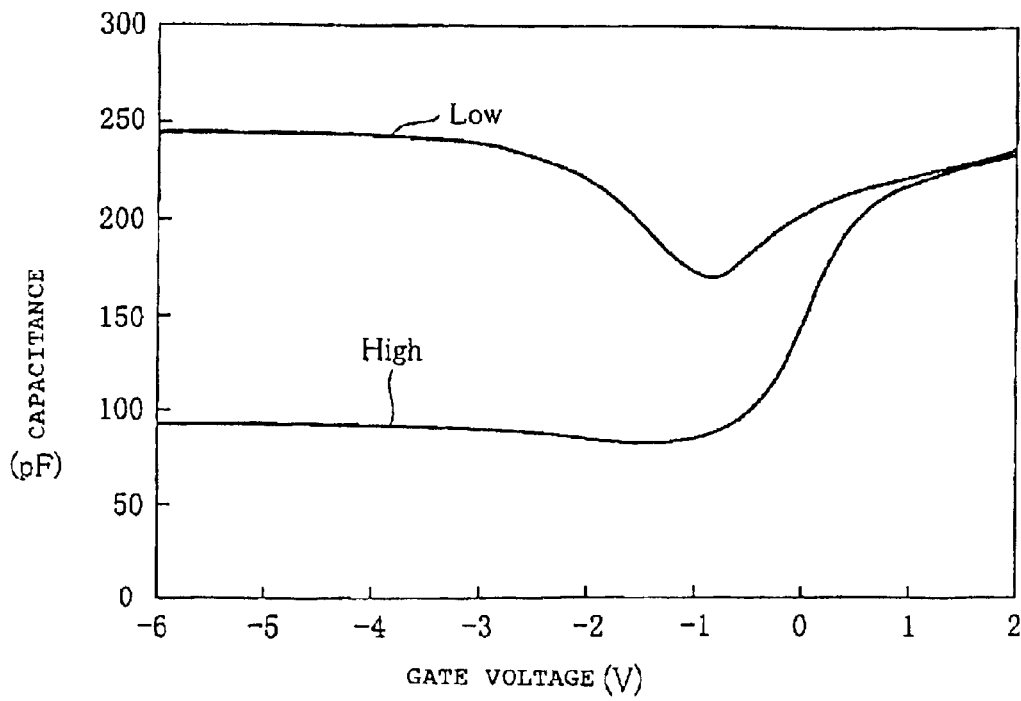
FIG. 7 is a graph which shows a gate insulating film which was subjected to heat treatment without an aluminum film being deposited thereon in a comparative example.
Figure 8:
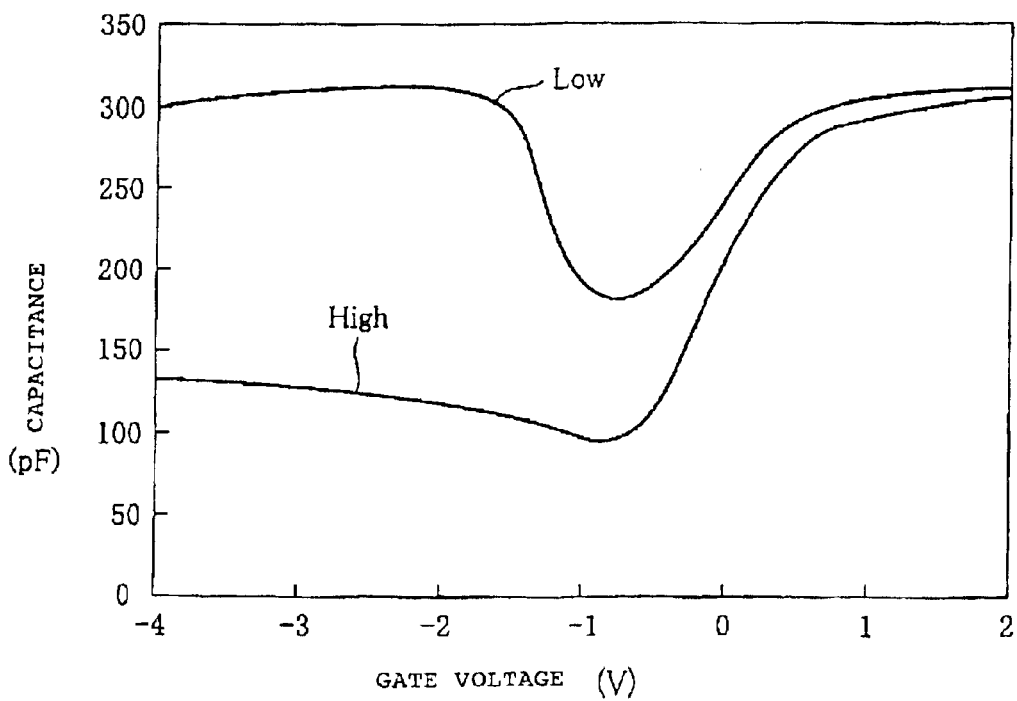
FIG. 8 is a graph which shows a gate insulating film which was subjected to heat treatment with an aluminum film being deposited thereon in a comparative example.

FIGS. 7 and 8 are graphs showing the improvement in the C-V characteristics of the gate insulating films. In FIG. 7, the gate insulating film was formed by an ECR plasma enhanced CVD process, and aluminum was not deposited thereon, and then heat treatment (400° C., in a nitrogen atmosphere, 1 hour) was performed. In FIG. 8, the gate insulation film was formed by an ECR plasma enhanced CVD process, and aluminum was deposited thereon, and then heat treatment (400° C., in a nitrogen atmosphere, 1 hour) was performed.

Next, a more preferable example of the present invention will be described with reference to FIGS. 1(a) to 1(h) and FIGS. 2(i) to 2(m).

A substrate 11 and a protective underlayer 12 as described above were used in this example. More specifically, as the sustrate 11, a general purpose alkali-free glass substrate in the square shape of 300 mm×300 mm was used. First, the protective underlayer 12 composed of an insulating material was formed on the substrate 11. In this example, a silicon oxide film 12 with a thickness of approximately 500 nm was deposited by a diode parallel plate PECVD system (FIG. 1(a)).

Next, a semiconductor film 13 composed of an intrinsic semiconductor, which would act as an active layer of the thin-film transistor, was formed. The thickness of the semiconductor film 13 was approximately 50 nm. In this example, an amorphous silicon film was deposited at a deposition temperature of 425° C. using a high-vacuum LPCVD system by flowing disilane ($Si_2H6$) as a source gas at approximately 200 sccm.

First, a plurality of substrates (e.g., 17 substrates) were placed so that the front sides faced downward in a reaction chamber of the high-vacuum LPCVD system, the temperature of the reaction chamber being adjusted to 250° C. A turbo-molecular pump was then started. After the turbo-molecular pump reached a steady rotation speed, the temperature of the reaction chamber was raised from 250° C. to 425° C., taking approximately 1 hour. For the initial 10 minutes from the start of temperature rise, no gas was introduced and the temperature was raised in a vacuum, and then a nitrogen gas with a purity of 99.9999% or more was continuously flowed into the reaction chamber at 300 sccm. At this stage, the equilibrium pressure in the reaction chamber was $3.0 \times 10^{-3}$ Torr. After the deposition temperature was achieved, disilane ($Si_2H_6$), which was a source gas, was flowed into the reaction chamber at 200 sccm and simultaneously helium (He) with a purity of 99.9999% or more for diluting use was flowed into the reaction chamber at 1,000 sccm. The pressure in the reaction chamber immediately after the start of deposition was approximately 0.85 Torr. The pressure in the reaction chamber gradually increased, and the pressure immediately before the finish of deposition was approximately 1.25 Torr. In the silicon film 13 thus deposited, in the region of 286 mm×286 mm square, other than the peripheral region of the substrate 11 with a width of approximately 7 mm, the variation in thickness was within ±5%.

Next, laser beam irradiation was performed. In this example, xenon chloride (XeCl) excimer laser beams (wavelength:308 nm) were applied. The intensity full width at half maximum (with respect to time) of the laser pulse was 25 ns.

The substrate was placed in a chamber so that the laser beam was applied from the back face, and the substrate temperature was increased to 300° C. The irradiation area of one shot was linear with a length of 150 mm and a width of 400 $\mu$m, and the energy density at the irradiated surface was 400 mJ/cm$^2$. Irradiation was repeated while shifting the laser beam in the width direction at an overlap rate of 95% (i.e., by 20 $\mu$m for each irradiation). The amorphous silicon in the entire substrate whose side was 300 mm was thus crystallized. In order to minimize the roughness at the grain boundaries of the semiconductor layer due to the crystallization, the line beam was provided with edge regions (i.e., regions with a low energy density) in the width direction with a width of 200 $\mu$m, and the amorphous silicon film (a-Si) was irradiated with the laser at a lower energy density before it was irradiated at an energy density of 400 mJ/cm$^2$. By increasing the irradiation energy stepwise as described above, crystallization was performed while controlling the surface roughness. (FIG. 1(b)).

Next, in order to perform photolithography, a photoresist 14 was applied to a region which was to be serving as an active layer of the transistor, followed by patterning (FIG. 1(c)). The semiconductor film 13 was etched using the photoresist layer 14 as a mask. In order to etch the semiconductor film 13, chemical dry etching was performed using a mixed gas of sulfur hexafluoride ($SF_6$) gas and chlorine gas ($Cl_2$) (FIG. 1(d)). After the semiconductor film was etched, the photoresist was removed (FIG. 1(e)).

Next, the substrate 11 was transported to a chamber for forming an insulating film. TEOS gas, oxygen ($O_2$) gas, and helium (He) gas were introduced into the chamber, and the chamber pressure was adjusted to 1 Torr. After the gas pressure in the chamber was stabilized, radio-frequency (RF) discharge was started to form an insulating film. The input microwave power was 1 kW. The film was formed at a rate of 100 nm/min. Thereby, a gate insulating film 15 was formed with a thickness of 100 mn (FIG. 1(f)).

Next, the substrate 11 was moved to a sputtering chamber, and aluminum (Al) was deposited by sputtering to a thickness of 300 nm at ambient temperature to form a metal film 16. For the sputtering process, argon (Ar) gas was used, the pressure was set at 0.2 Pa, and 1 kW of a direct current was input (FIG. 1(g)).

Next, the substrate 11 was placed in a furnace, the temperature was increased to 400° C., and heat treatment was performed in a nitrogen atmosphere for 30 minutes. The substrate 11 was then recovered, and aluminum (Al) was removed from the entire surface by wet etching using an acid (FIG. 1(h)).

Next, a tantalum thin film 17 which was to be serving as a gate electrode was formed by sputtering to a thickness of 600 nm. The substrate temperature was 180° C. when the tantalum thin film was formed (FIG. 2(i)).

After the thin film 17 was deposited, patterning was performed. Impurity ions were introduced into the semiconductor film to form source and drain regions and a channel region. At this stage, since the gate electrode 17 functioned as a mask for ion implantation, a self-aligned structure was obtained in which the channel was formed only under the gate electrode. In this example, in order to fabricate an NMOS transistor, implantation was performed with an ion implanter, using phosphine ($PH_3$) as a source gas, at an acceleration voltage of 100 key. The ion dosage was $1 \times 10^{16}$ cm$^{-2}$.

Next, in order to activate the implanted impurity phosphorus, heat treatment was performed in a nitrogen atmosphere at 300° C. for 4 hours.

Next, in order to form an interlayer insulting film 18, a silicon oxide film was deposited to a thickness of 500 nm by a diode parallel plate PECVD process (FIG. 2(k)). Contact holes were then formed at the positions corresponding to the source and drain regions, and source and drain lead electrodes and a wiring film 19 were formed by a PVD process or CVD process (FIG. 2(l)). The film 19 was patterned, and a protective film was deposited thereon. The thin-film transistor was thereby completed (FIG. 2(m)).

Additionally, the heat treatment carried out in the state in which the metal film is formed on the gate insulating film may be performed with appropriate timing, for example, before or after patterning, in the fabrication process of the transistor, or by the time when the fabrication of a panel provided with a plurality of transistors is completed.

The TFTs fabricated by the low-temperature fabrication process of the present invention are particularly suitable for use in liquid crystal display devices and organic EL display devices using large glass substrates in which low-temperature processes are desired. Examples of electronic apparatuses using such display devices will be described below. However, it should be understood that the present invention is not limited thereto, and that various other devices can be used without departing from the spirit and scope of the present invention.

Figure 9:
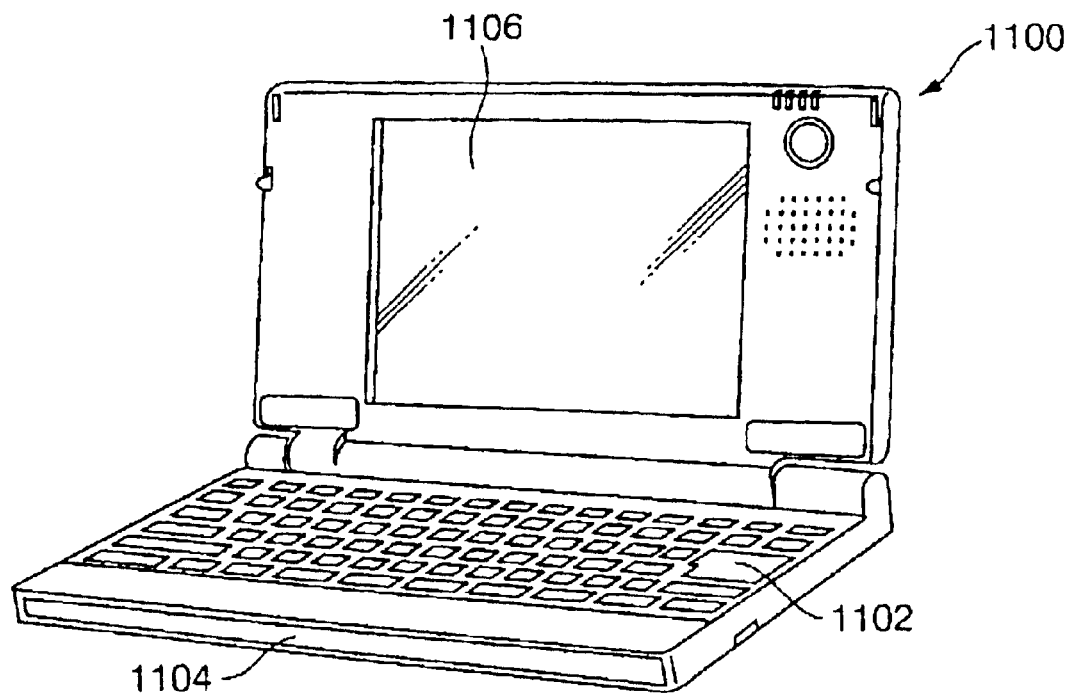
FIG. 9 is a perspective view showing an example of a mobile personal computer which includes TFTs of the present invention.

First, an example in which a display device including transistors in accordance with the embodiment of the present invention described above is applied to a mobile personal computer (information processing apparatus) will be described. FIG. 9 is a perspective view showing a structure of the personal computer. As shown in the drawing, a personal computer 1100 includes a body 1104 provided with a keyboard 1102, and a display unit provided with a display device 1106.

Figure 10:
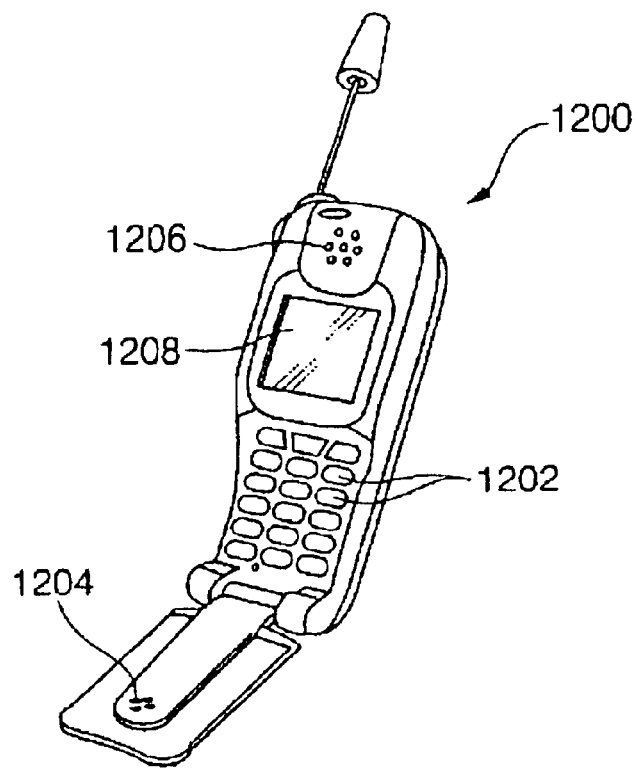
FIG. 10 is a perspective view showing an example of a mobile phone which includes TFTs of the present invention.

Next, an example in which a display device in accordance with the embodiment of the present invention is applied to the display section of a mobile phone will be described. FIG. 10 is a perspective view showing a structure of the mobile phone. As shown in the drawing, a mobile phone 1200 includes a plurality of manual operation buttons 1202, an earpiece 1204, a mouthpiece 1206, and a display device 1208.

Figure 11:
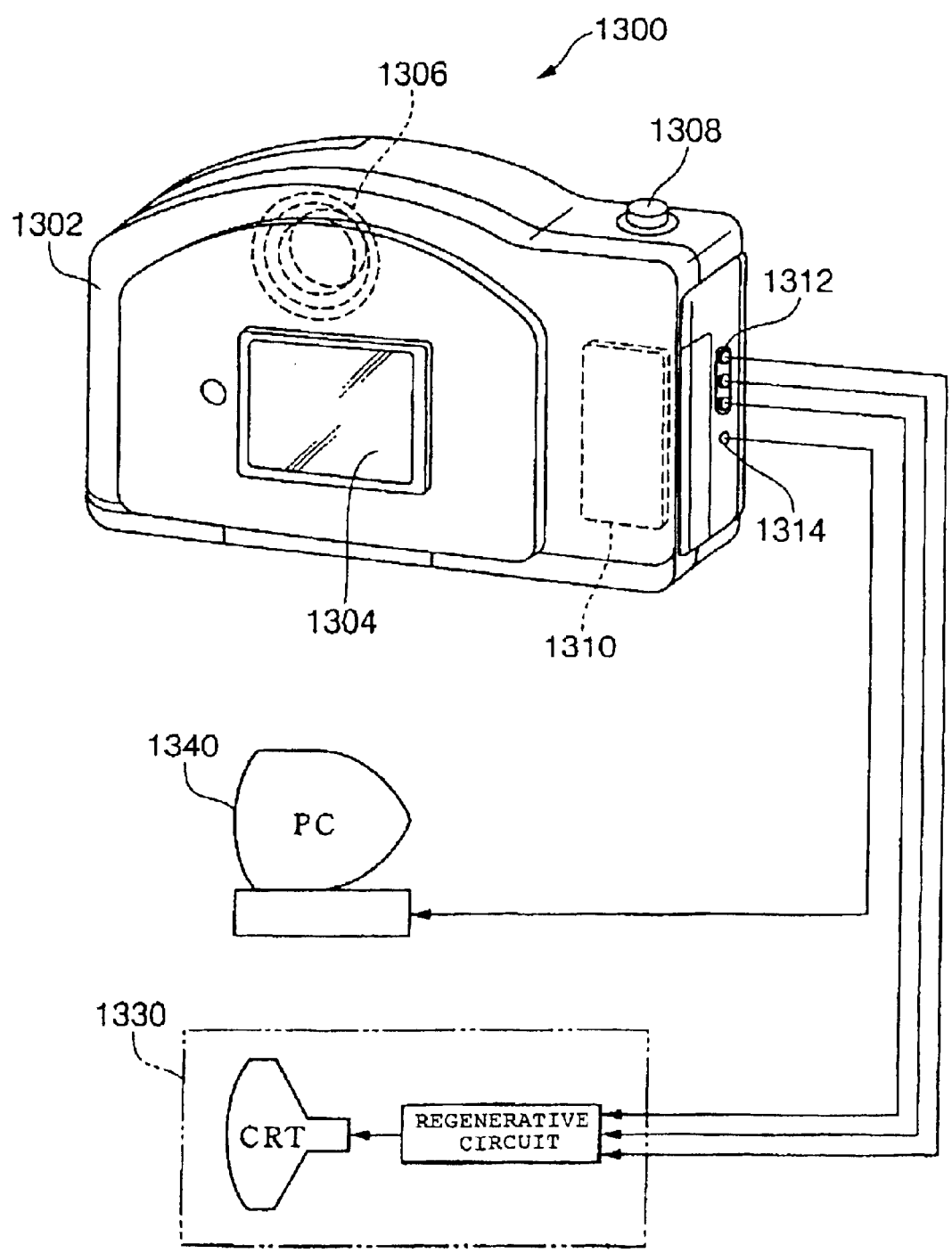
FIG. 11 is a perspective view showing an example of a digital camera which includes TFTs of the present invention.

A digital still camera in which a display device in accordance with the embodiment is used as a finder will be described. FIG. 11 is a perspective view which shows a structure of the digital still camera and which also schematically shows the connection to external apparatuses.

While a film is exposed to light by the light figure of an object in the ordinary camera, in a digital still camera 1300, the light image of an object is photoelectrically converted by an imaging device, such as a charge coupled device (CCD), to generate imaging signals. A display device 1304 is provided on the back face of a case 1302 of the digital still camera 1300, and a display is performed based on the imaging signal by the CCD. Consequently, the display device 1304 functions as a finder for displaying an object. A light-receiving unit including an optical lens, a CCD, etc., is provided on the viewing side of the case 1302 (back side in FIG. 11).

When a photographer confirms the image of the object displayed on the display device 1304 and triggers a shutter 1308, the imaging signal of the CCD at the time is transferred to and stored in the memory of a circuit substrate 1310. In this digital still camera 1300, video signal output terminals 1312 and input/output terminal 1314 for data communication are provided on the side of the case 1302. As shown in FIG. 11, as necessary, a TV monitor 1330 is connected to the video signal output terminals 1312, and a personal computer 1340 is connected to the input/output terminal 1314. Furthermore, by predetermined operation, the image signal stored in the memory of the circuit substrate 1310 is output to the TV monitor 1330 and the computer 1340.

Figure 12:
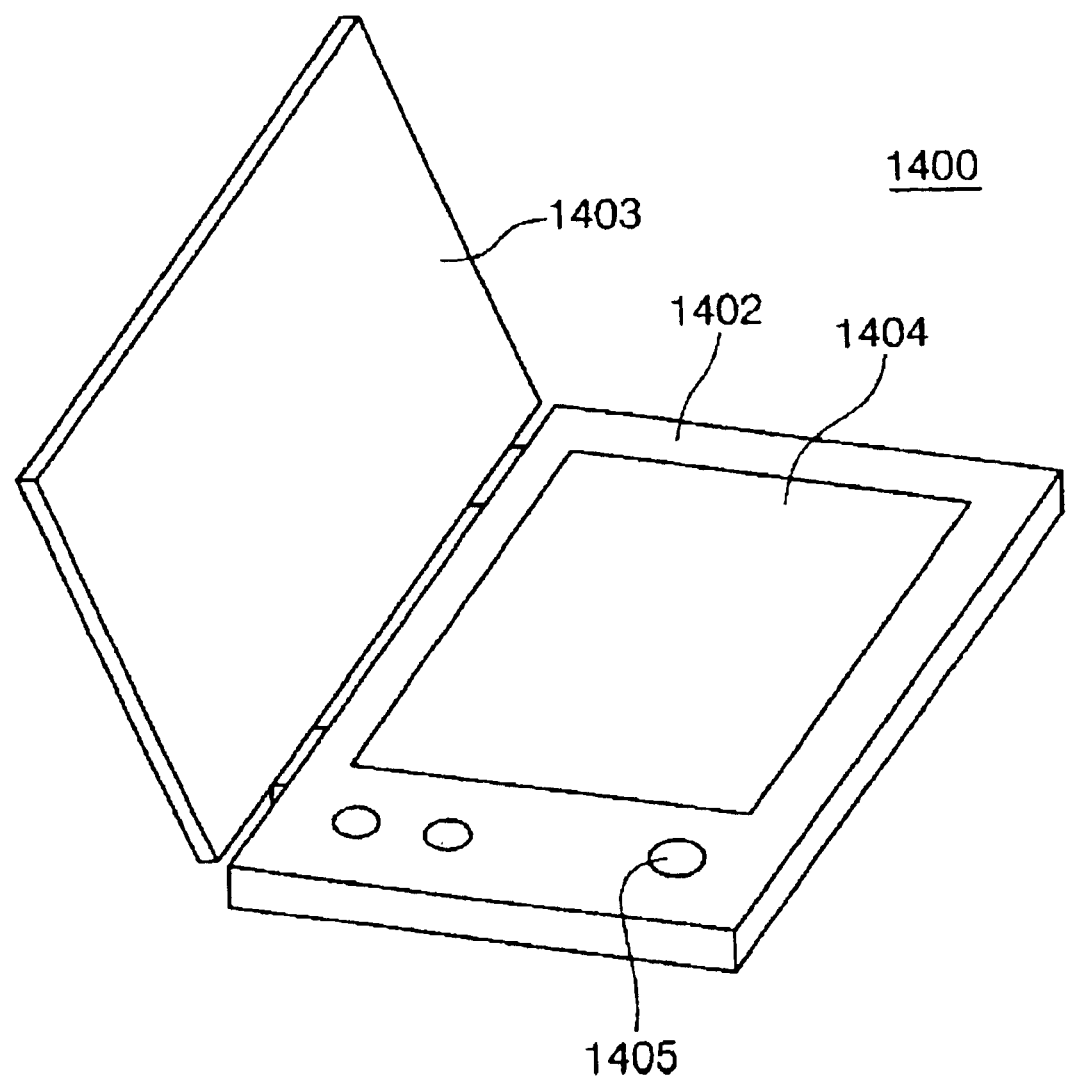
FIG. 12 is a perspective view showing an example of an electronic book which includes TFTs of the present invention.

FIG. 12 is a perspective view showing a structure of an electronic book which is an example of the electronic apparatus of the present invention. Reference numeral 1400 represents an electronic book. The electronic book 1400 includes a book-size frame 1402, and an openable cover 1403 attached to the frame 1402. A display device 1404 is provided on the frame 1402 with its display section being exposed to the surface, and an operation unit 1405 is also provided on the frame 1402. A controller, a counter, a memory, etc., are built inside the frame 1402. The display device 1404 includes a pixel unit formed by filling electronic ink into thin-film elements, an integrated peripheral circuit integrally provided with the pixel unit. The peripheral circuit includes a decoder-type scan driver and data driver.

In addition to the personal computer shown in FIG. 9, the digital still camera shown in FIG. 10, and the electronic book shown in FIG. 11, other examples of the electronic apparatuses and information processing apparatuses include electronic papers, liquid crystal televisions, viewfinder type or monitor-direct-view type video tape recorders, car navigation devices, pagers, electronic pocketbooks, electronic calculators, word processors, workstations, television telephones, POS terminals, apparatuses provided with touch panels, and the like. The display device described above is applicable to the display section of each of these various electronic apparatuses.

As described above, in the conventional TFT fabricating technique, it was difficult to decrease the density of defects at the MOS interface and simultaneously to decrease the charge density and increase the dielectric breakdown voltage of the gate insulating film. Therefore, improvement in the transistor performance was limited. By the present invention, it has become possible to form an extremely high-quality gate insulating film by a low-temperature process, and it has become possible to fabricate a high-performance transistor by a low-temperature process.

In addition to TFTs, the present invention is applicable to the semiconductor elements and semiconductor devices in which high-quality silicon oxide/silicon interfaces and bulk characteristics of silicon oxide films are required. In particular, when the formation at low temperatures is absolutely necessary, the present invention is extremely effective.

In accordance with the present invention, it is possible to form a high-quality gate insulating film having both satisfactory bulk characteristics and satisfactory interface characteristics by a low-temperature process.

What is claimed is:

1. A method for fabricating a transistor, comprising:
   forming a semiconductor film over a substrate;
   forming a gate insulating film over the semiconductor film;
   forming a metal film over the gate insulating film to cover an entire interface between the gate insulating film and the semiconductor film; and
   performing heat treatment to the gate insulating film through the metal film.

2. The method for fabricating a transistor according to claim 1, the gate insulating film comprising a silicon oxide.

3. The method for fabricating a transistor according to claim 1, the gate insulating film being formed using a silicon-containing compound.

4. The method for fabricating a transistor according to claim 3, the silicon-containing compound comprising tetraethoxysilane (TEOS).

5. The method for fabricating a transistor according to claim 1, the gate insulating film being formed by a diode parallel plate plasma enhanced CVD process.

6. The method for fabricating a transistor according to claim 1, the metal film comprising a material which decomposes or removes impurities contained in the gate insulating film.

7. The method for fabricating a transistor according to claim 6, the impurities comprising at least one of oxygen, hydrogen, and water.

8. The method for fabricating a transistor according to claim 1, the metal film comprising at least one of aluminum and magnesium.

9. The method for fabricating a transistor according to claim 1, the heat treatment decreasing the density of a carrier trap state resulting from defects in the gate insulating film or at the interface between the gate insulating film and the semiconductor film.

10. The method for fabricating a transistor according to claim 1, the transistor being a thin-film transistor.

11. The method for fabricating a transistor according to claim 10, the thin-film transistor being fabricated at approximately 500° C. or less.

12. The method for fabricating a transistor according to claim 1, further comprising patterning the metal film so that the metal film is used as a gate wiring film of the transistor.

13. The method for fabricating a transistor according to claim 1, further comprising removing the metal film and forming a wiring film on the gate insulating film, the wiring film serving as a gate electrode of the transistor.

14. The method for fabricating a transistor according to claim 1, the heat treatment to the gate insulating film being performed at 300° C. or more and in a temperature range which does not affect the semiconductor film and the substrate.

15. The method for fabricating a transistor according to claim 1, the step of forming the gate insulating film being performed so that the temperature of the substrate does not exceed 400° C.

16. The method for fabricating a transistor according to claim 1, further comprising, after the step of forming the semiconductor film, the step of crystallizing the semiconductor film by laser annealing.

17. The method for fabricating a transistor according to claim 1, wherein the substrate is any one of a semiconductor substrate, a semi-insulating substrate, and an insulating substrate.

* * * * *